United States Patent
Gao

(10) Patent No.: US 11,178,795 B1
(45) Date of Patent: Nov. 16, 2021

(54) MODULAR THERMOELECTRIC-BASED COOLING DEVICE FOR HETEROGENEOUS PACKAGES

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/894,487

(22) Filed: Jun. 5, 2020

(51) Int. Cl.
  *H05K 7/20* (2006.01)
  *G06F 1/20* (2006.01)

(52) U.S. Cl.
  CPC ........... *H05K 7/20781* (2013.01); *G06F 1/20* (2013.01); *H05K 7/20463* (2013.01); *H05K 7/20472* (2013.01); *H05K 7/20509* (2013.01); *H05K 7/20772* (2013.01); *G06F 2200/201* (2013.01); *H05K 7/20518* (2013.01)

(58) Field of Classification Search
  CPC . H05K 7/20518; H05K 7/20509; H01L 23/38
  USPC ......... 361/709–710, 719; 165/80.2; 257/706, 257/713; 62/3.2, 3.6
  See application file for complete search history.

(56) References Cited

U.S. PATENT DOCUMENTS

| | | | | |
|---|---|---|---|---|
| 6,424,533 B1 * | 7/2002 | Chu | ........................ | H01L 23/38 257/930 |
| 8,058,724 B2 * | 11/2011 | Refai-Ahmed | ........ | H01L 23/427 257/707 |
| 9,941,558 B2 * | 4/2018 | Gruenwald | ........ | H01M 10/6572 |
| 2020/0031242 A1 * | 1/2020 | Thomas | .................. | F25B 21/02 |

* cited by examiner

*Primary Examiner* — Zachary Pape
(74) *Attorney, Agent, or Firm* — Womble Bond Dickinson (US) LLP

(57) ABSTRACT

A cooling device for a heterogeneous microchip is fabricated such that different cooling profiles can be provided for different chips. A housing is made of thermal conductive material, the housing having a plurality of channels formed therein. Electric contacts are provided inside each of the channels. Each channel can fit either a thermoelectric cooling device or a metallic block to provide different cooling profiles and design requirements. The cooling device is inserted between a liquid cooling plate and the chip to adjust and enhance heat transfer from the chip to the cooling plate. Alternatively, the cooling plate itself can serve as the housing with the channels, in which case the housing is provided with coupling for liquid pipes or hoses.

20 Claims, 8 Drawing Sheets

MODULAR THERMOELECTRIC-BASED COOLING DEVICE FOR HETEROGENEOUS PACKAGES

FIELD OF THE INVENTION

Embodiments of the present invention relate generally to cooling of packaged semiconductor devices. More particularly, embodiments of the invention relate to cooling of heterogeneous packages of semiconductor devices.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers.

Recent advancement in packaging of microchips includes heterogeneous integration or heterogeneous packaging. Heterogeneous integration refers to the assembly and packaging of multiple separately manufactured components onto a single chip in order to improve functionality and enhance operating characteristics. Heterogeneous integration allows for the packaging of components of different functionalities, different process technologies (i.e., process nodes), different thermal properties and characteristics and sometimes separate manufacturers. The combined devices can vary in functionality (e.g., processors, signal processors, cache, sensors, photonics, RF, and MEMS) and technologies (e.g., one optimized for die size with another one optimized for low power).

However, since each of the combined devices has different power consumption and heat dissipation characteristics, packaging them in a single enclosure raises challenges to the thermal management of such packaging. In addition, the packaging may include auxiliary power units which also have different heat dissipation characteristics. Therefore, the entire package may be in non-uniform thermal conditions during normal operation.

Furthermore, each of the packaged components may have different thermal specifications/requirements, such as junction temperature or case temperature for normal operation. It is critical to satisfy these requirements for the thermal management solutions, especially when these requirements are different for the various packaged devices.

A proper thermal design requires satisfying the thermal management specifications of all of the components within the heterogeneous package. Therefore, the design must account for the most temperature sensitive component operating at peak power consumption, even if such operation takes place only occasionally.

The packaging locations and footprint of each device within the package are mainly determined based on technical considerations other than thermal management. The technical considerations may be based on, e.g., actual topology, communication requirements, such I/O fabric distance, and so on. Therefore, the thermal design should be flexible sufficiently to accommodate the package requirements.

On the other hand, providing different thermal management solution for each different package increases cost and complexity of manufacturing. A standard design or product is important for reducing the cost, as well as for developing an ecosystem with multiple vendors. However, it is a challenge to have only one common product and specification to satisfy different type of heterogeneous packages and to solve the thermal challenges mentioned.

BRIEF DESCRIPTION OF THE DRAWINGS

Embodiments of the invention are illustrated by way of example and not limitation in the figures of the accompanying drawings in which like references indicate similar elements.

FIGS. 4A and 4B are top view of a heat transfer device according to an embodiment, wherein FIG. 4A shows the device without heat transfer elements and FIG. 4B illustrate the device with heat transfer elements inserted.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The current disclosure introduces a modular design and packaging method using thermoelectric cooling devices, which may solve the thermal problems efficaciously. Aspects of the disclosure provide a modular design which may be used for cooling different types and designs of packages and provide thermal cooling for highly non-uniform power and thermal conditions in different locations in the heterogeneous package.

Disclosed embodiments provide a cooling layer that enables placement of different types of heat conductors at different locations on the heterogeneous package. The different heat conductors can be selected according to the heat transfer requirements at different spatial locations of the package. For example, a metallic block, such as a copper block, may be used at some locations, while a thermoelectric cooling (TEC) device can be used at locations requiring enhanced heat conduction.

Figure 1:
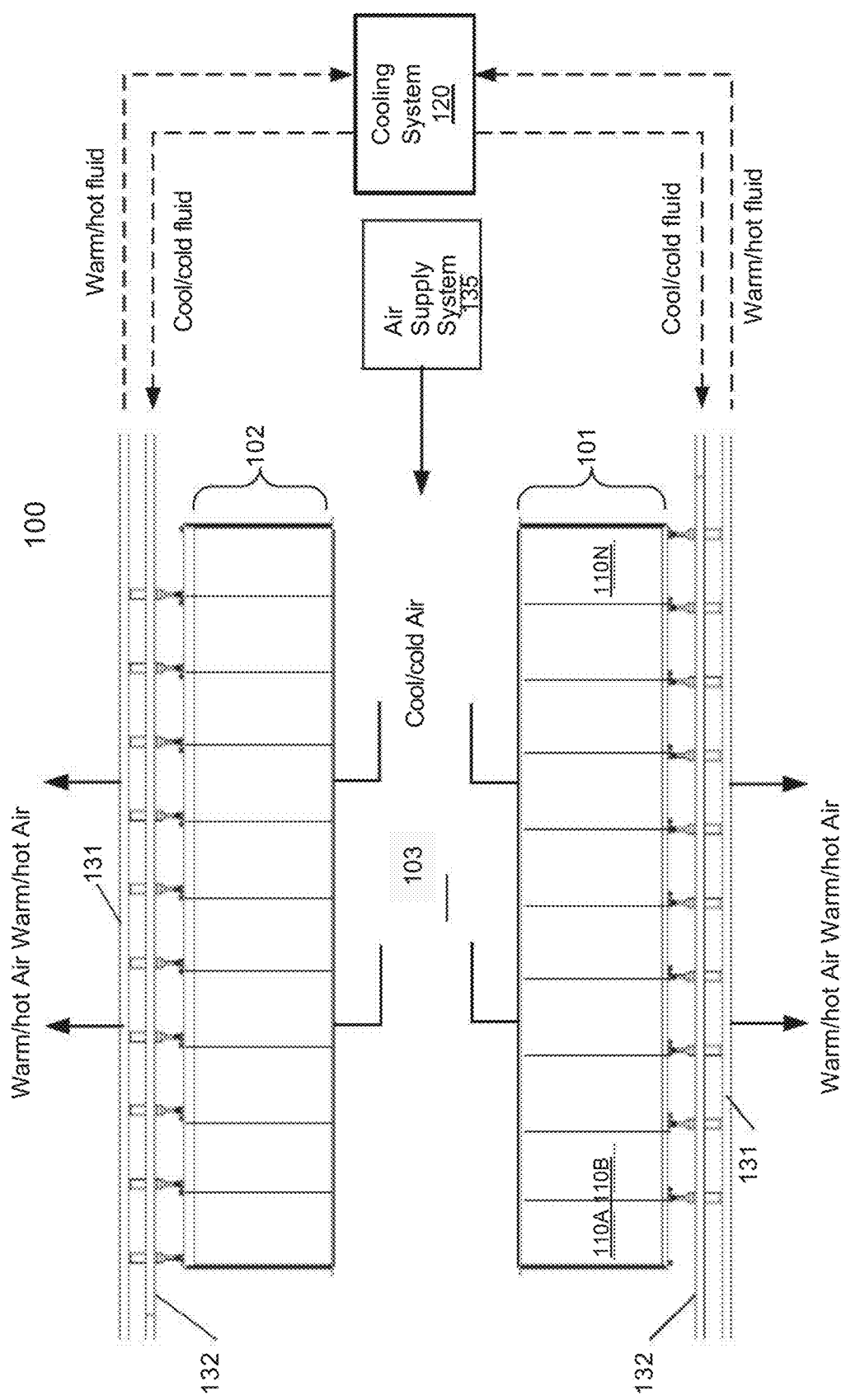
FIG. 1 is a block diagram illustrating an example of a data center facility according to one embodiment.

Prior to discussing the particulars of different embodiments, the description provides some background regarding example environments where the embodiments may be implemented. FIG. 1 is a block diagram illustrating an example of a data center or data center unit according to one embodiment. In this example, FIG. 1 shows a top view of at least a portion of a data center. Referring to FIG. 1, according to one embodiment, data center system 100 includes one or more rows of electronic racks of information technology (IT) components, equipment or instruments 101-102, such as, for example, computer servers or computing nodes that provide data services to a variety of clients over a network (e.g., the Internet). In this embodiment, each row includes an array of electronic racks such as electronic racks 110A-110N. However, more or fewer rows of electronic racks may be implemented. Typically, rows 101-102 are aligned in parallel with frontends facing towards each other and backends facing away from each other, forming aisle 103 in between to allow an administrative person walking therein. However, other configurations or arrangements may also be applied. For example, two rows of electronic racks may back to back face each other without forming an aisle in between, while their frontends face away from each other. The backends of the electronic racks may be coupled to the room cooling liquid manifolds.

In one embodiment, each of the electronic racks (e.g., electronic racks 110A-110N) includes a housing to house a number of IT components arranged in a stack operating therein. The electronic racks can include a cooling liquid manifold, a number of server slots (e.g., standard shelves or chassis configured with an identical or similar form factor), and a number of server chassis (also referred to as server blades or server shelves) capable of being inserted into and removed from the server slots. Each server chassis represents a computing node having one or more processors, a memory, and/or a persistent storage device (e.g., hard disk), where a computing node may include one or more servers operating therein. At least one of the processors is attached to a liquid cold plate (also referred to as a cold plate assembly) to receive cooling liquid. In addition, one or more optional cooling fans are associated with the server chassis to provide air cooling to the computing nodes contained therein. Note that the cooling system 120 may be coupled to multiple data center systems such as data center system 100.

In one embodiment, cooling system 120 includes an external liquid loop connected to a cooling tower or a dry cooler external to the building/housing container. The cooling system 120 can include, but is not limited to evaporative cooling, free air, rejection to large thermal mass, and waste heat recovery designs. Cooling system 120 may include or be coupled to a cooling liquid source that provide cooling liquid.

In one embodiment, each server chassis is coupled to the cooling liquid manifold modularly, such that a server chassis can be removed from the electronic rack without affecting the operations of remaining server chassis in the electronic rack and the cooling liquid manifold. In another embodiment, each server chassis is coupled to the cooling liquid manifold through a quick-release coupling assembly having a server liquid intake connector and a server liquid outlet connector coupled to a flexible hose to distribute the cooling liquid to the processors. The server liquid intake connector is to receive cooling liquid via a rack liquid intake connector from a cooling liquid manifold mounted on a backend of the electronic rack. The server liquid outlet connector is to emit warmer or hotter liquid carrying the heat exchanged from the processors to the cooling liquid manifold via a rack liquid outlet connector and then back to a coolant distribution unit (CDU) within the electronic rack. The CDU may also be a standalone unit instead of populated on a server rack.

In one embodiment, the cooling liquid manifold disposed on the backend of each electronic rack is coupled to liquid supply line 132 (also referred to as a room supply manifold) to receive cooling liquid from cooling system 120. The cooling liquid is distributed through a liquid distribution loop attached to a cold plate assembly on which a processor is mounted to remove heat from the processors. A cold plate is configured similar to a heat sink with a liquid distribution tube attached or embedded therein. The resulting warmer or hotter liquid carrying the heat exchanged from the processors is transmitted via liquid return line 131 (also referred to as a room return manifold) back to cooling system 120.

Liquid supply/return lines 131-132 are referred to as data center or room liquid supply/return lines (e.g., global liquid supply/return lines), which supply cooling liquid to all of the electronic racks of rows 101-102. The liquid supply line 132 and liquid return line 131 are coupled to a heat exchanger of a CDU located within each of the electronic racks, forming a primary loop. The secondary loop of the heat exchanger is coupled to each of the server chassis in the electronic rack to deliver the cooling liquid to the cold plates of the processors. Cold plate is widely used component for liquid cooling, although other type of liquid cooling components may also connect to the liquid cooling secondary loop.

In one embodiment, data center system 100 further includes an optional airflow delivery system 135 to generate an airflow to cause the airflow to travel through the air space of the server chassis of the electronic racks to exchange heat generated by the computing nodes due to operations of the computing nodes (e.g., servers) and to exhaust the airflow exchanged heat to an external environment or a cooling system (e.g., air-to-liquid heat exchanger) to reduce the temperature of the airflow. For example, air supply system 135 generates an airflow of cool/cold air to circulate from aisle 103 through electronic racks 110A-110N to carry away exchanged heat.

The cool airflows enter the electronic racks through their frontends and the warm/hot airflows exit the electronic racks from their backends. The warm/hot air with exchanged heat is exhausted from room/building or cooled using a separate cooling system such as an air-to-liquid heat exchanger. Thus, the cooling system is a hybrid liquid-air cooling system, where a portion of the heat generated by a processor is removed by cooling liquid via the corresponding cold plate, while the remaining portion of the heat generated by the processor (or other electronics or processing devices) is removed by airflow cooling.

Figure 2:
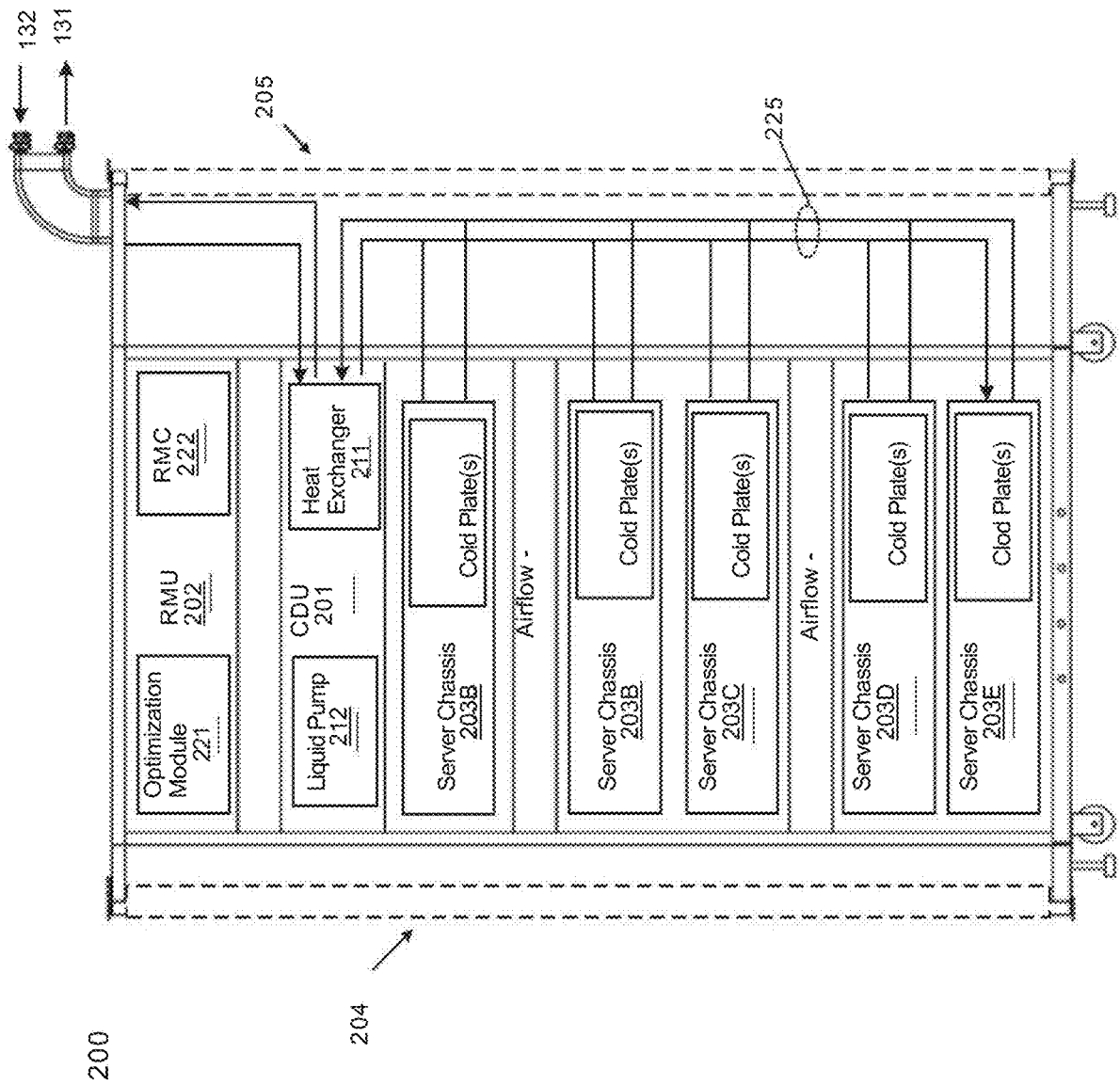
FIG. 2 is a block diagram illustrating an example of an electronic rack according to one embodiment.

FIG. 2 is block diagram illustrating an electronic rack according to one embodiment. Electronic rack 200 may represent any of the electronic racks as shown in FIG. 1, such as, for example, electronic racks 110A-110N. Referring to FIG. 2, according to one embodiment, electronic rack 200 includes, but is not limited to, CDU 201, rack management unit (RMU) 202, and one or more server chassis 203A-203E (collectively referred to as server chassis 203). Server chassis 203 can be inserted into an array of server slots (e.g., standard shelves) respectively from frontend 204 or backend 205 of electronic rack 200. Note that although there are five server chassis 203A-203E shown here, more or fewer server chassis may be maintained within electronic rack 200. Also note that the particular positions of CDU 201, RMU 202, and/or server chassis 203 are shown for the purpose of illustration only; other arrangements or configurations of CDU 201, RMU 202, and/or server chassis 203 may also be implemented. In one embodiment, electronic rack 200 can be either open to the environment or partially contained by a rack container, as long as the cooling fans can generate airflows from the frontend to the backend.

In addition, for at least some of the server chassis 203, an optional fan module (not shown) is associated with the server chassis. Each of the fan modules includes one or more cooling fans. The fan modules may be mounted on the backends of server chassis 203 or on the electronic rack to generate airflows flowing from frontend 204, traveling through the air space of the sever chassis 203, and existing at backend 205 of electronic rack 200.

In one embodiment, CDU 201 mainly includes heat exchanger 211, liquid pump 212, and a pump controller (not shown), and some other components such as a liquid reservoir, a power supply, monitoring sensors and so on. Heat exchanger 211 may be a liquid-to-liquid heat exchanger. Heat exchanger 211 includes a first loop with inlet and outlet ports having a first pair of liquid connectors coupled to external liquid supply/return lines 131-132 to form a primary loop. The connectors coupled to the external liquid supply/return lines 131-132 may be disposed or mounted on backend 205 of electronic rack 200. The liquid supply/return lines 131-132, also referred to as room liquid supply/return lines, may be coupled to cooling system 120 as described above.

In addition, heat exchanger 211 further includes a second loop with two ports having a second pair of liquid connectors coupled to liquid manifold 225 (also referred to as a rack manifold) to form a secondary loop, which may include a supply manifold (also referred to as a rack liquid supply line or rack supply manifold) to supply cooling liquid to server chassis 203 and a return manifold (also referred to as a rack liquid return line or rack return manifold) to return warmer liquid back to CDU 201. Note that CDUs 201 can be any kind of CDUs commercially available or customized ones. Thus, the details of CDUs 201 will not be described herein.

Each of server chassis 203 may include one or more IT components (e.g., central processing units or CPUs, general/graphic processing units (GPUs), memory, and/or storage devices). Each IT component may perform data processing tasks, where the IT component may include software installed in a storage device, loaded into the memory, and executed by one or more processors to perform the data processing tasks. Server chassis 203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The compute servers perform the actual tasks, which may generate heat during the operations.

Electronic rack 200 further includes optional RMU 202 configured to provide and manage power supplied to servers 203, and CDU 201. RMU 202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.) to provide power to the rest of the components of electronic rack 200.

In one embodiment, RMU 202 includes optimization module 221 and rack management controller (RMC) 222. RMC 222 may include a monitor to monitor operating status of various components within electronic rack 200, such as, for example, computing nodes 203, CDU 201, and the fan modules. Specifically, the monitor receives operating data from various sensors representing the operating environments of electronic rack 200. For example, the monitor may receive operating data representing temperatures of the processors, cooling liquid, and airflows, which may be captured and collected via various temperature sensors. The monitor may also receive data representing the fan power and pump power generated by the fan modules 231 and liquid pump 212, which may be proportional to their respective speeds. These operating data are referred to as real-time operating data. Note that the monitor may be implemented as a separate module within RMU 202.

Based on the operating data, optimization module 221 performs an optimization using a predetermined optimization function or optimization model to derive a set of optimal fan speeds for fan modules 231 and an optimal pump speed for liquid pump 212, such that the total power consumption of liquid pump 212 and fan modules 231 reaches minimum, while the operating data associated with liquid pump 212 and cooling fans of the fan modules are within their respective designed specifications. Once the optimal pump speed and optimal fan speeds have been determined, RMC 222 configures liquid pump 212 and cooling fans of fan modules 231 based on the optimal pump speeds and fan speeds.

As an example, based on the optimal pump speed, RMC 222 communicates with a pump controller of CDU 201 to control the speed of liquid pump 212, which in turn controls a liquid flow rate of cooling liquid supplied to the liquid manifold 225 to be distributed to at least some of server chassis 203. Similarly, based on the optimal fan speeds, RMC 222 communicates with each of the fan modules to control the speed of each cooling fan of the fan modules 231, which in turn control the airflow rates of the fan modules. Note that each of fan modules may be individually controlled with its specific optimal fan speed, and different fan modules and/or different cooling fans within the same fan module may have different optimal fan speeds.

Note that the rack configuration as shown in FIG. 2 is shown and described for the purpose of illustration only; other configurations or arrangements may also be applicable. For example, CDU 201 may be an optional unit. The cold plates of server chassis 203 may be coupled to a rack manifold, which may be directly coupled to room manifolds 131-132 without using a CDU. Although not shown, a power supply unit may be disposed within electronic rack 200. The power supply unit may be implemented as a standard chassis identical or similar to a sever chassis, where the power supply chassis can be inserted into any of the standard shelves, replacing any of server chassis 203. In addition, the power supply chassis may further include a battery backup unit (BBU) to provide battery power to server chassis 203 when the main power is unavailable. The BBU may include one or more battery packages and each battery package include one or more battery cells, as well as the necessary charging and discharging circuits for charging and discharging the battery cells.

Figure 3:
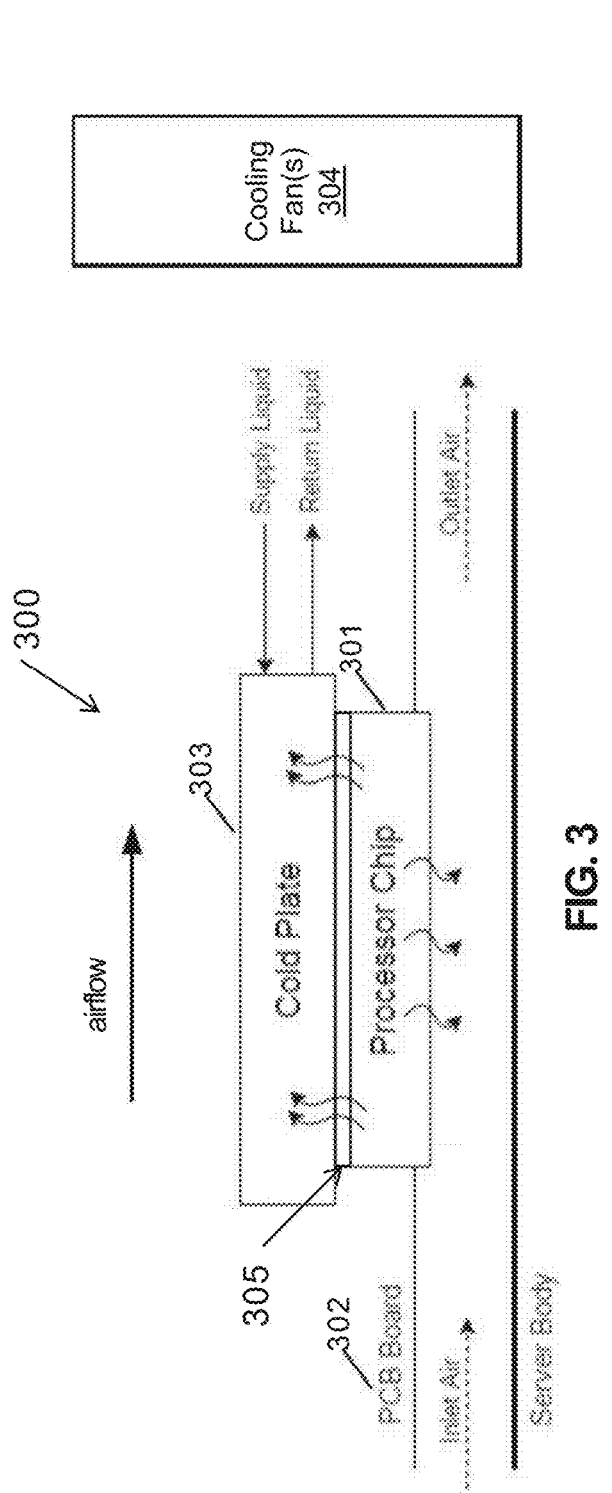
FIG. 3 is a block diagram illustrating an example of a cold plate configuration according to one embodiment.

FIG. 3 is a block diagram illustrating a processor cold plate configuration according to one embodiment. The processor/cold plate assembly 300 can represent any of the processors/cold plate structures of server chassis 203 as shown in FIG. 2. Referring to FIG. 3, processor chip 301 is plugged onto a processor socket mounted on printed circuit board (PCB) or motherboard 302 coupled to other electrical components or circuits of a data processing system or server. Processor chip 301 also includes a cold plate 303 attached to it, which is coupled to a rack manifold that is coupled to liquid supply line 132 and/or liquid return line 131. A portion of the heat generated by processor chip 301 is removed by the cooling liquid via cold plate 303. The remaining portion of the heat enters into an air space underneath or above, which may be removed by an airflow generated by cooling fan 304. In other embodiments, the cold plate 303 can be in the form of other types of cooling devices, such as air cooled heat sink, two phase cooling device, etc. For brevity, in the following description cold plate is used as an example but each of the disclosed embodiments may be implemented using any other cooling device.

In FIG. 3, when processor chip 301 is a heterogeneous package, the heat generated over the surface of the package is not uniform. Therefore, in FIG. 3 a heat transfer device 305 is inserted between the packaged processor chip 301 and the cold plate 303 to extract heat from the package 301 and transfer the heat to the cold plate 303 at different rates over the surface of packaging 301. In disclosed embodiments the heat transfer device 305 is modular and can be fitted to different packaging having different thermal profile over their surface. The example of FIG. 3 illustrates the heat transfer device 305 as being separate from the cold plate 303; however, in other embodiments the heat transfer device 305 may be integral to the cold plate 303.

Disclosed embodiments provide composite structure utilizing heat transfer elements, including thermoelectric cooling devices, for thermal management of heterogeneous packaged processors. One or multiple thermoelectric coolers are used in the thermal transfer devices, optionally in combination with other heat transfer elements, such as copper blocks. A dedicated layer with specified spaces is used for assembling the heat transfer elements, e.g., thermoelectric coolers, to enhance the heat transfer from the packaged chip to the cold plate. The thermal transfer device includes one or several specified spaces in which different thermal transfer elements can be inserted. Examples include TEC unit or passive conduction copper block for different design targets. Electrical connections are designed within each of the spaces for powering any inserted TEC with DC power source. Insulators are used for multiple locations as well as on the copper blocks. A complete composite packaging structure is disclosed.

The disclosed innovative structural design enables installing and disassembling of one or more TEC units and copper blocks easily, and once inserted, they are in good contact with the housing to eliminate gaps, in order to ensure proper thermal management. In one embodiment, the layer can be designed as a separated unit packaging between the cooling device such as cold plate or heat sink and the heterogeneous ASIC package. In other embodiments it can be integrated to the cooling device.

Figure 4C:
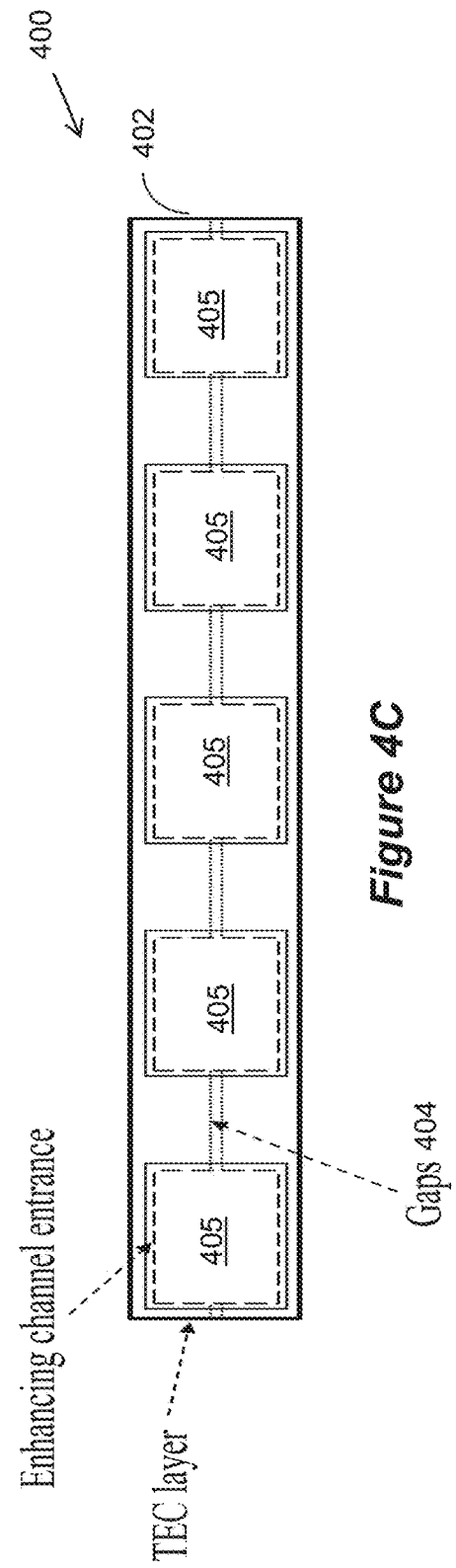
FIG. 4C illustrates a front view of the thermal transfer device according to an embodiment.
Figure 4A:
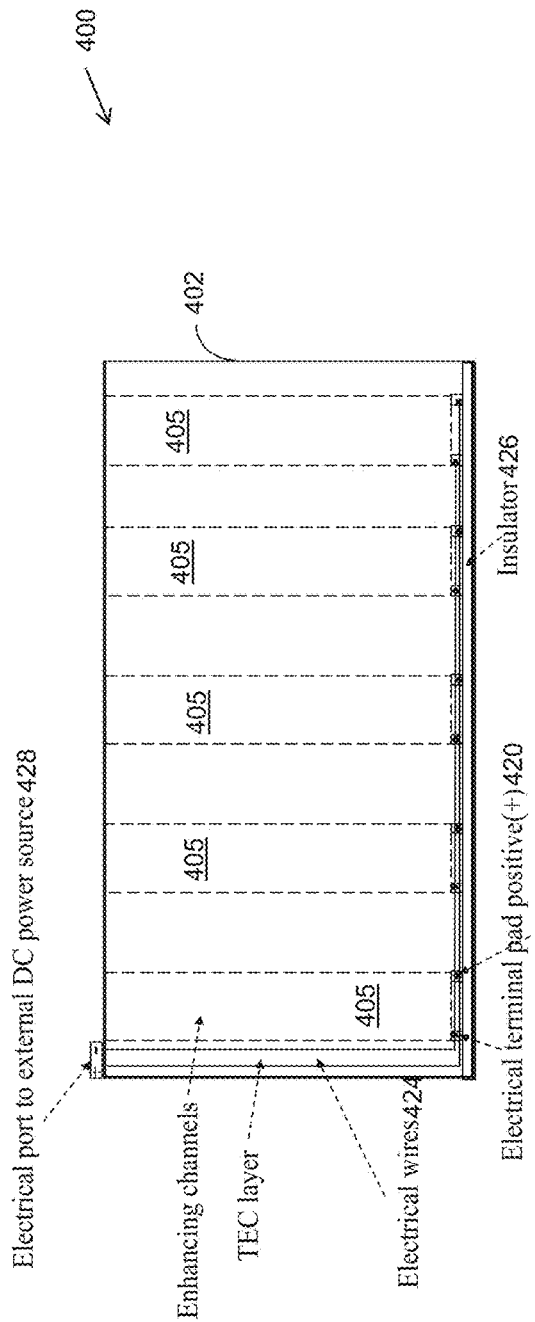
Figure 4B:
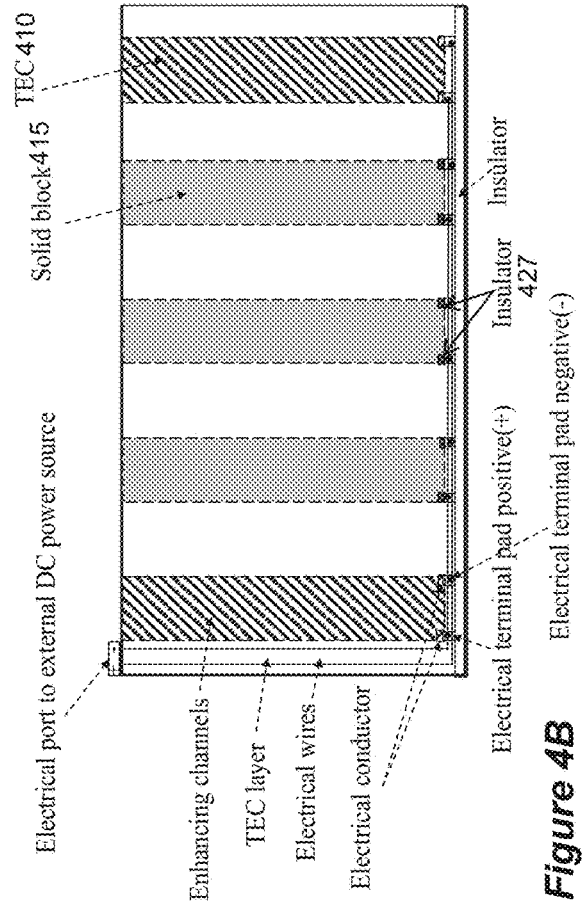

FIGS. 4A and 4B are top view of a heat transfer device according to an embodiment, wherein FIG. 4A shows the device without heat transfer elements and FIG. 4B illustrate the device with heat transfer elements inserted. As illustrated, the heat transfer device 400 has an encapsulation or housing 402 that includes multiple channels 405, which may be referred to as enhancing channels as they function to enhance heat transfer. In this particular example, five channels 405 are illustrated, but any number of channels can be formed. These channels 405 are used for inserting therein TEC units 410 and copper blocks 415 in different combinations, depending on the particular heat transfer requirements. If the channel 405 is populated with TEC 410, the footprint of the channel and TEC are aimed to fully or partially cover the top of the surface of a special component requiring enhance heat transfer. The special component can refer to high power components, high temperature sensitive components, components requiring better cooling conditions, component positioned in a location where it is not fully covered by a cold plate main cooling area, and so on. When a regular block 415 is used, it indicates that no enhanced cooling is need in a direction normal to the surface of the package in that location. In disclosed embodiments the material of the heat transfer block 415 is the same as the encapsulation 402 of thermal transfer device 400 so as not to degrade the heat transfer.

Electrical terminal pads 420 and 422, as well as electrical wires 424 are pre-assembled within the thermal transfer device 400. Once a TEC 410 is inserted, it is automatically connected to the electrical terminals 420 and 422, and ready to receive DC power. The terminal pad has positive side 420 and negative side 422 for each of the channels 405, such that each channel can be populated with TEC. An insulator 426 is shown on the bottom to isolate the encapsulation 402 from the power source. An electrical port 428 is used to connect to external DC power source. In one embodiment, the positive and native ports can be switched or multiple power ports can be used to switch the cold side and hot side of the TEC. When a copper block is inserted, it is insulated at the ends to prevent it from being connected to the electrical terminals.

FIG. 4B shows an assembled thermal transfer device wherein TEC 410 and passive blocks 415 are inserted in the channels 405. In the particular example illustrated, TEC 410 are inserted into the two end channels 405 and solid blocks 415 are inserted in the middle three channels. This example is specific to a situation wherein the two end regions of the heterogeneous package require enhanced heat transfer wherein the footprint of the two TEC 410 covers the area occupied by the temperature sensitive components. Of course this is but one example and the channels 405 may be populated with different number and configuration of TEC and blocks as needed. Incidentally, an insulator 427 is needed on the blocks to insulate them from the electrical pads 420 and 422.

FIG. 4C illustrates a front view of the thermal transfer device 400 according to an embodiment. In the illustrated example, the thermal transfer device 400 is not yet fully assembled and no heat transfer elements have been inserted in channels 405. As shown, in this condition a very small gap exists between the upper portion and lower portion of the encapsulation 402. The gap 404 structure can be realized in different mechanical designs, e.g., machining the gap or making the encapsulation as two parts. This gap 404 is used for ease of inserting in or pulling out a TEC or block as needed. Thermal interface material (TIM) may be prefilled within the channel before any TEC or block is inserted to ensure proper heat conductivity.

As disclosed so far, the features introduced herein include modularity of design, ease of assembly, and uniform DC power connection. Modularity of design is enabled by the channels, wherein each channel may be loaded with a TEC or a metallic block, to fit different specifications. The closable gap enables easy assembly and removal of TEC and metallic blocks when the gap is open, but then provides good thermal conductivity when the gap is closed. The TIM on the interior walls of the channels also help is good thermal conductivity. Universal DC connection is enables by having DC terminals in each channel, and having mating terminals on the TEC, so that the TEC is automatically connected to the DC terminals upon insertion into the channel. This enables uniform design of TEC terminals which can be used for any heterogeneous packaging specification.

Figure 5A:
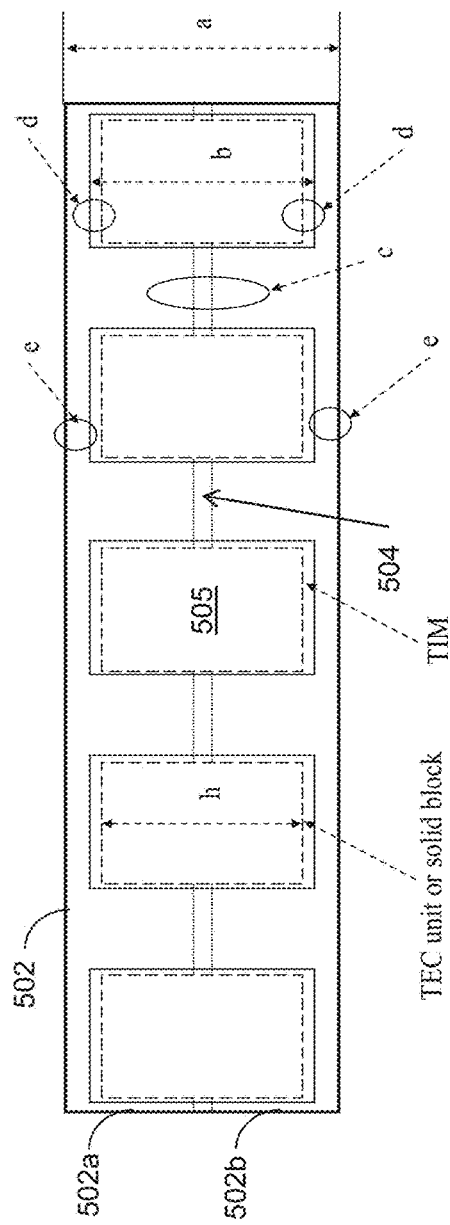
FIGS. 5A and 5B illustrate the detailed function of the gap as well as its design requirement according to an embodiment.
Figure 5B:
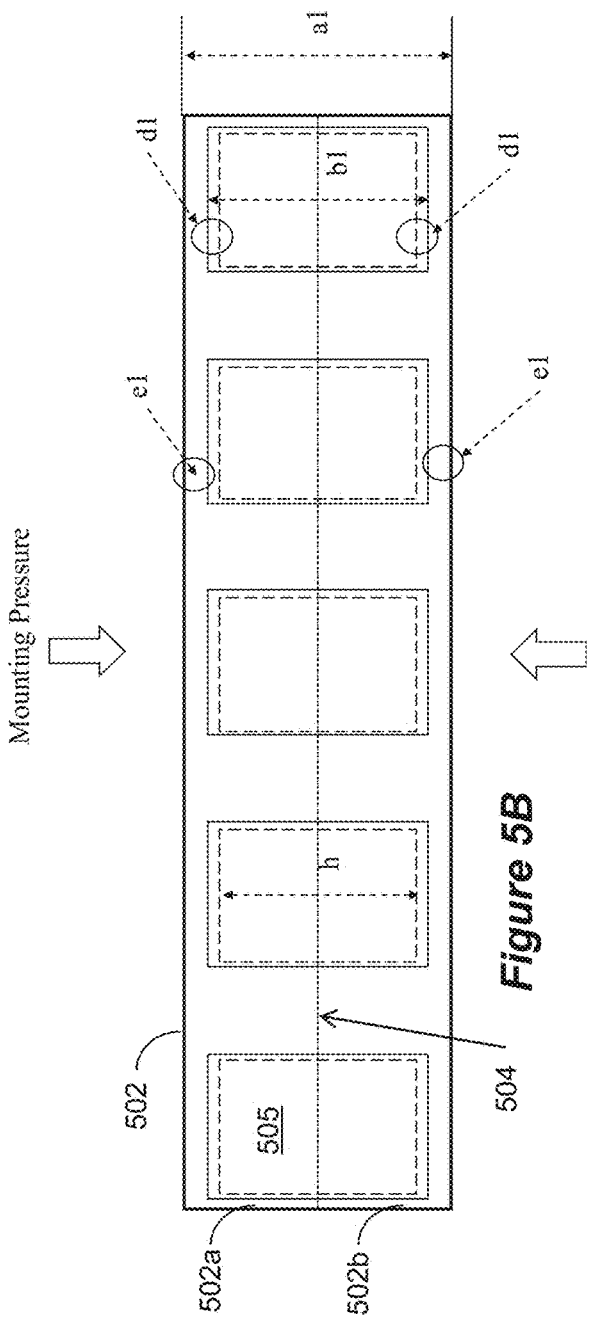

FIGS. 5A and 5B illustrate the detailed function of the gap as well as its design requirements according to an embodiment. FIG. 5A illustrates the thermal transfer device 500 before assembling and fixing, while FIG. 5B illustrates the thermal transfer device 500 after assembling and fixing with pressure loading. It can be seen that the gap 504 shown in FIG. 5A is closed in FIG. 5B when the unit is assembled and pressure loaded. To improve the heat conductivity of the device illustrated in FIGS. 5A and 5B the following may be implemented. The copper blocks and TEC are built to have the same dimensions, and in FIGS. 5A and 5B height h presents the height of a TEC or a block.

For reducing manufacturing costs, the form factor of the TEC and block is fixed. Height a represents the total height of the encapsulation 502 before assembly and height a1 represents the height after assembly. Height b represents the height of the channel 505 before assembly and height b1 represents the height after assembly, wherein height b1 theoretically equals height h. Height d represents half the difference between the height b of the channel and height h of the TEC or block. Height c represents the height of the gap 504 before assembly. In this position theoretically c=2d, but in practice c is slightly smaller than 2d. Theoretically heights c1 and d1 are zero after assembly; however, in practice it is recommended that a TIM (thermal interface material) be lined inside the channels to fill any gaps between the encapsulation and the TEC or block after assembly.

Figure 5C:
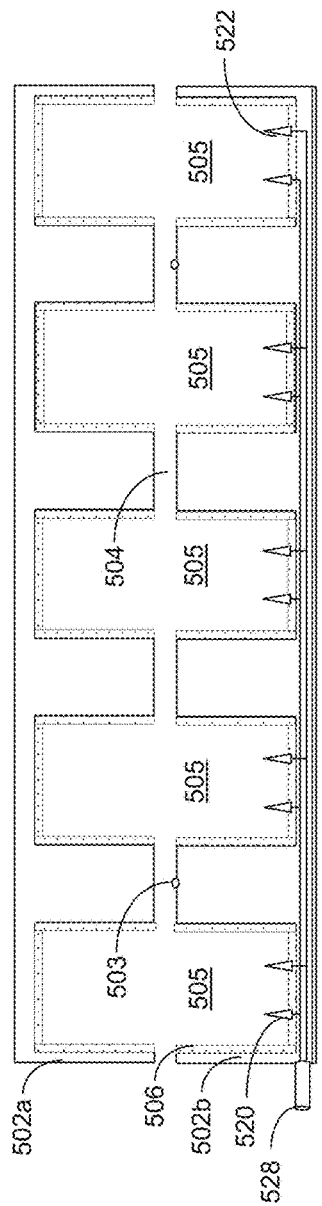
FIGS. 5C-5E are cross-sections illustrating different embodiments for fabricating the encapsulation parts of the thermal transfer device.

As can be understood from FIG. 5A, the encapsulation 502 may be fabricated in one machined part or two sections 502a and 502b. FIG. 5C is a cross-section illustrating an embodiment wherein encapsulation 502 is made of two mirror-image parts 502a and 502b. The parts can be assembled together while a resilient element 503, e.g., an O-ring, maintains the gap when no pressure is applied forcing the two sections to compress the resilient element and close the gap 504. Also, the interior walls of channels 505 are lined with TIM 506 to provide better thermal conductivity between the encapsulation and the heat transfer elements. Additionally, DC terminals 520 and 522 are provide in each channel and are connected to electrical port 528. Consequently, there's a single uniform design for connecting the TEC to DC power, and the connection is achieved automatically upon insertion of a TEC into a channel. Specifically, the TEC is fabricated with electrical terminals that mate with terminals 520 and 522 upon insertion. Conversely, the metallic blocks are provided with insulation at the same physical location of the DC terminals, so that they do not short the terminals.

Figure 5D:
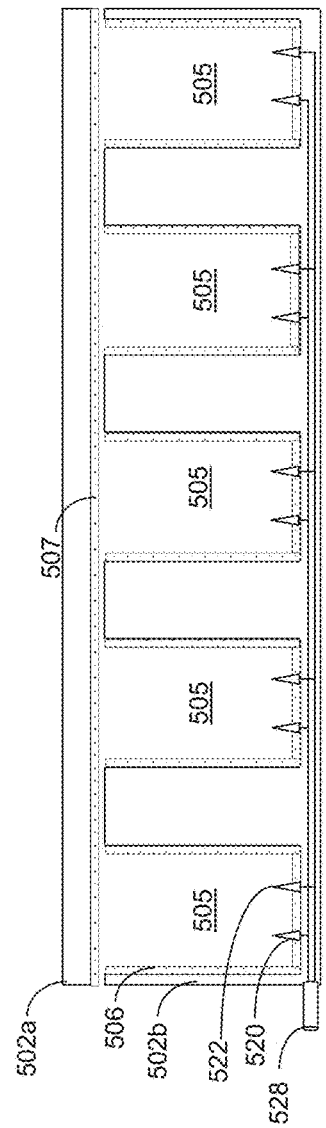

FIG. 5D is a cross-section illustrating an embodiment wherein the encapsulation 502 is made of two different parts. Specifically, in this example part 502b forms a main block with channels 505. Part 502a forms a lid, which may be in the form of a plate without any part of the channels. Also, in this embodiment interior walls of cavities 505 are lined with TIM 506. The surface of the lid facing the main block 502b is lined with TIM 507, which may be the same as TIM 506 or may be an adhesive TIM to adhere the lid to the main block 502b.

Figure 5E:
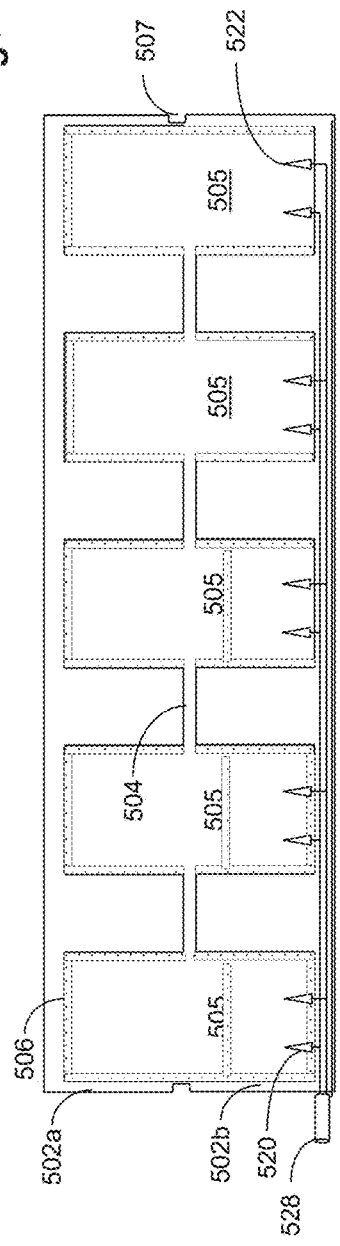

FIG. 5E is a cross-section illustrating an embodiment wherein encapsulation 502 is made of a single block, e.g. machined out of a block of copper. In this example, channels 505 and gap 504 are machined out of the block, such that after insertion of the heat transfer elements in the channels 505 the two sections 502a and 502b can be compressed together. This can be achieved by, e.g., creation of crumple zones 507, which may also function as a resilient element to return the gap to its original orientation after removal of compression force.

In the disclosed examples the parts of the encapsulation 502 are made of the same material as the blocks 415, e.g., copper. The interior walls of the channels 505 are lined with TIM. Once the thermal requirements of the chip to be cooled are understood, it is decided in which channel(s) 505 a TEC will be inserted and in which a block will be inserted. After the TEC and blocs have been inserted in the selected channels, the two sections are brought together and compressed to result in the arrangement shown in FIG. 5B. Note that the two sections can be brought together first as shown in FIG. 5A and then the TEC and blocks inserted in the respective channels.

Figure 6:
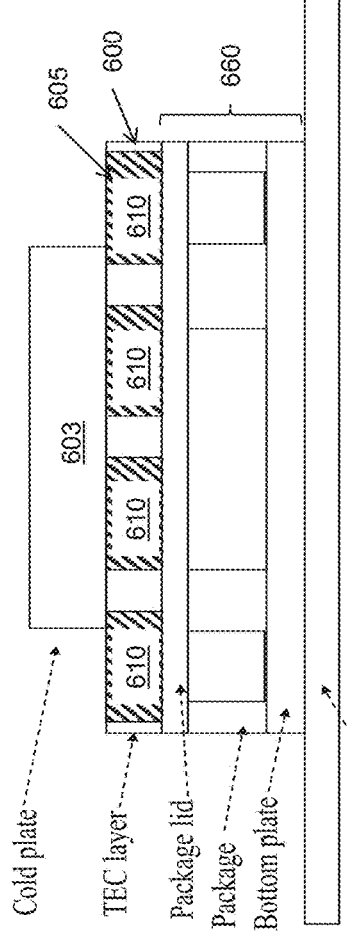
FIG. 6 illustrates a diagram of a side view of system level integrated component package using an embodiment of the heat transfer device.

FIG. 6 shows a diagram of a side view of system level integrated component package using an embodiment of the heat transfer device 600. In this particular example TEC 610 is inserted in all of the channels 605. The heat transfer device 600 is compressed between the cold plate 603 and the heterogeneous package device 660. As illustrated in FIG. 6, since the TEC enhances the heat transfer from package 660 the cold plate 603 may be smaller, having less heat transfer area while still satisfy the heat removal requirements.

Figure 7:
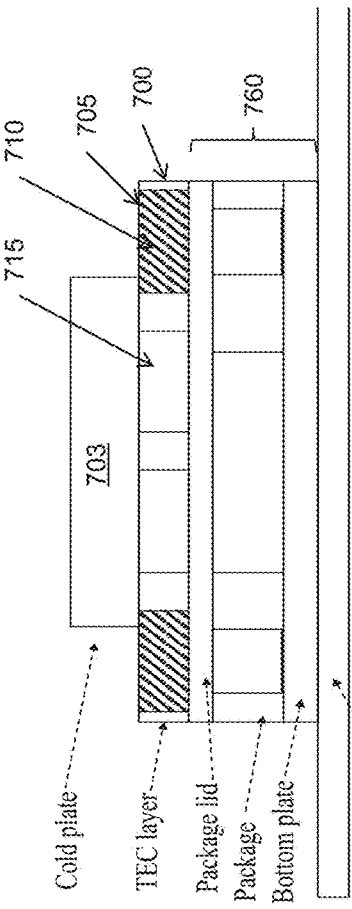
FIG. 7 illustrates a diagram of a side view of system level integrated components package using an embodiment of the heat transfer device.

FIG. 7 shows a diagram of a side view of system level integrated components package using an embodiment of the heat transfer device 700. In this example, TEC 710 is inserted in the two end channels 705 and blocks 715 are inserted in the middle channels. This is done in order to transfer heat from the edges of the package 760 to the cold plate faster than in the center.

Figure 8:
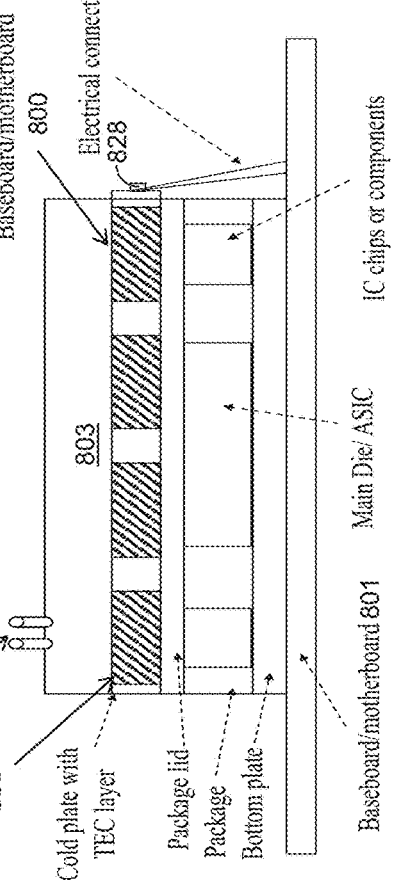
FIG. 8 illustrates a diagram of a side view of system level integrated components package using an embodiment of the heat transfer device that is integrated into the cold plate.

FIG. 8 illustrates an embodiment wherein the thermal transfer device 800 is integrated with the cold plate 803 as one complete unit. In essence, the cold plate 803 forms the housing of the thermal transfer device 800, such that the channels 805 are formed directly in the cold plate 803. The cold plate may be liquid cooled via liquid coupling 808. In this particular example each of the channels is filled with a TEC.

Also illustrated in FIG. 8, and can be implemented in any of the other embodiments albeit not illustrated, are electrical connections 870 from the electrical port 828 of the thermal transfer device 800 to the motherboard 801. Power may also be applied from other sources, but having the power from the mother board is convenient as it is close by.

Figure 9:
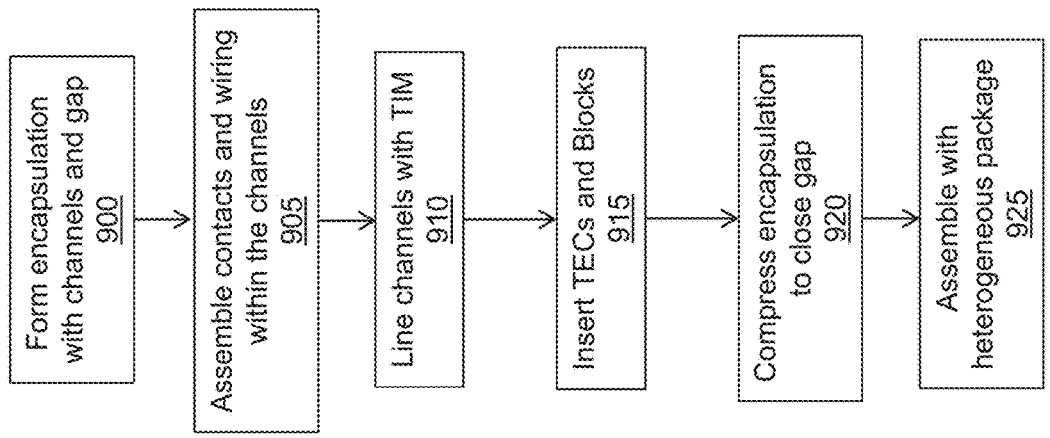
FIG. 9 is a flow chart illustrating a process for fabricating the cooling device according to an embodiment.

FIG. 9 is a flow chart illustrating a process for fabricating the cooling device according to an embodiment. In block 900, an encapsulation is fabricated with channels and gap, according to any of the embodiments disclosed herein. In block 905 the electrical contacts and wiring is installed within the channels. In block 910 the interior walls of the channels are lined or coated with TIM. In block 915 one or more TEC devices and one or more metallic blocks are inserted in the channels, according to the heat transfer requirements of the heterogeneous package. During steps 900-915 the cooling device is not assembled yet within the cold plate and heterogeneous package, so the gap enables easy insertion of the TEC and metallic blocks. Also, when the TEC is inserted into one of the channels, it is automatically connected to the electrical terminals within the channel. At block 920 the encapsulation is compressed to close the gap. This can be done together with step 925, wherein the cooling device is assembled with the heterogeneous package and a cooling plate.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling device for a heterogeneous microchip, comprising:
   a housing made of thermal conductive material, the housing having a plurality of channels formed therein;
   electric contacts provided inside each of the plurality of channels;
   at least one thermoelectric cooling device (TEC) inserted in one of the channels; and
   at least one metallic block inserted in one of the channels.

2. The cooling device of claim 1, wherein all of the plurality of channels have the same dimensions.

3. The cooling device of claim 2, further comprising thermal interface material provided on interior walls of the channels.

4. The cooling device of claim 2, wherein the housing further comprises a compressible gap formed among the channels.

5. The cooling device of claim 4, wherein the compressible gap separates the housing into two parts.

6. The cooling device of claim 4, wherein a height of the channel less a height of the gap equals a height of the TEC.

7. The cooling device of claim 4, further comprising a resilient element to maintain the gap in an open position.

8. The cooling device of claim 2, further comprising direct-current (DC) electrical terminals provided within each of the plurality of channels.

9. The cooling device of claim 2, wherein the housing and the metallic block are made out of copper.

10. A method for providing cooling to a server node having a heterogeneous chip, comprising:
    providing a cooling transfer device having a plurality of channels formed therein;
    obtaining a heat distribution specification of the heterogeneous chip and according to the heat distribution specification, inserting at least one thermoelectric cooling (TEC) element in at least one of the channels, and inserting metallic blocks in remaining empty channels; and
    attaching the cooling transfer device to the heterogeneous chip.

11. The method of claim 10, further comprising installing electrical contacts in each of the plurality of channels, such that inserting the thermoelectric cooling (TEC) element in one of the channels automatically engages the electrical contacts to supply DC power to the TEC.

12. The method of claim 11, wherein attaching the cooling transfer device to the heterogeneous chip comprises compressing the cooling transfer device between the heterogeneous chip and a cooing plate.

13. The method of claim 12, wherein the cooling transfer device is provided with a gap intersecting the plurality of channels, and wherein compressing the cooling transfer device closes the gap.

14. The method of claim 10, further comprising coating interior walls of the channels with thermal interface material.

15. The method of claim 10, further comprising affixing liquid coupling to the cooling transfer device.

16. A server node, comprising:
    a motherboard;
    a heterogeneous chip affixed to the motherboard;
    a heat transfer device attached to a lid of the heterogeneous chip, the heat transfer device comprising:
        a housing made of thermal conductive material, the housing having a plurality of channels formed therein;
        electric contacts provided inside each of the plurality of channels;
        at least one thermoelectric cooling device (TEC) inserted in one of the channels; and,
        at least one metallic block inserted in one of the channels.

17. The server node of claim 16, further comprising leads connecting the electric contacts to the motherboard.

18. The server node of claim 16, further comprising a cooling plate attached on top of the housing.

19. The server node of claim 16, further comprising thermal interface material provided on interior walls of the channels.

20. The server node of claim 16, further comprising cooling pipes coupled to the housing.

* * * * *